United States Patent
Cho

(10) Patent No.: US 11,322,728 B2
(45) Date of Patent: May 3, 2022

(54) DISPLAY PANEL AND MANUFACTURING METHOD THEREOF

(71) Applicants: HKC Corporation Limited, Shenzhen (CN); Chongqing HKC Optoelectronics Technology Co., ltd., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 370 days.

(21) Appl. No.: 16/341,446

(22) PCT Filed: Dec. 12, 2017

(86) PCT No.: PCT/CN2017/115607
§ 371 (c)(1),
(2) Date: Apr. 12, 2019

(87) PCT Pub. No.: WO2018/233239
PCT Pub. Date: Dec. 27, 2018

(65) Prior Publication Data
US 2020/0176719 A1    Jun. 4, 2020

(30) Foreign Application Priority Data
Jun. 20, 2017 (CN) .......................... 201710470232.7

(51) Int. Cl.
| H01L 51/52 | (2006.01) |
| G02F 1/1337 | (2006.01) |
| G02F 1/1362 | (2006.01) |
| H01L 51/56 | (2006.01) |

(52) U.S. Cl.
CPC ........ H01L 51/5284 (2013.01); G02F 1/1337 (2013.01); G02F 1/136209 (2013.01); H01L 51/56 (2013.01); G02F 1/133769 (2021.01); H01L 2251/308 (2013.01)

(58) Field of Classification Search
CPC ....... H01L 51/52; H01L 51/56; G02F 1/1337; G02F 1/1362
See application file for complete search history.

(56) References Cited

U.S. PATENT DOCUMENTS

2012/0205646 A1* 8/2012 Cho .................... G02F 1/13318
                                                    257/43
2015/0179448 A1* 6/2015 Lee .................... H01L 21/02667
                                                    438/104

* cited by examiner

*Primary Examiner* — Marvin Payen

(57) ABSTRACT

The present disclosure provides a display panel and a manufacturing method for the display panel. The display panel includes a substrate, a switch assembly disposed on the substrate, and a light-sensing assembly disposed on a side of the switch assembly. The switch assembly comprises an indium gallium zinc oxide (IGZO) layer.

11 Claims, 4 Drawing Sheets

DISPLAY PANEL AND MANUFACTURING METHOD THEREOF

TECHNICAL FIELD

The present disclosure relates to a field of display technology, and particularly to a display panel and a manufacturing method for the display panel.

BACKGROUND

A display apparatus has advantages, such as a thin body, saving-power, no radiation, and is widely used. A conventional display apparatus mostly is a backlight display apparatus including a display panel and a backlight module. Operating principle of the display apparatus is that liquid crystal (LC) molecules are disposed between two substrates, where the two substrates are parallelly disposed, and a driver voltage applies on the two substrates to control a rotation direction of the LC molecules, so that light of a backlight module are refracted to generate images.

A thin film transistor-liquid crystal display (TFT-LCD) has some performances, such as low power consumption, excellent image quality, and high production yield, which has gradually occupied main position of a display field. The TFT-LCD includes a display panel and the backlight module, where the display panel includes a color filter (CF) substrate and a TFT substrate. A transparent electrode is disposed on inner side of the two substrates and the LC layer is disposed between the two substrates. The display panel controls the rotation direction of the LC molecules through electrical field, a polarization state of the light is changed, and penetration and blocking of light path are achieved through a polarizing plate to display.

As a liquid crystal display (LCD) product tends to develop into high-resolution, an LCD technology also has some urgent problems to solve. For example, a conventional display panel is not enough intelligent: when the conventional display panel is under the sun, the backlight of the conventional display panel is too dark to see the image, however, when the conventional display panel is in the dark, the conventional display panel is too bright and glare.

It should be noticed that a description of related prior art is to clearly and completely described for the technical scheme of the present disclosure, which is convenient to understand for a person skilled in the art. The above technology scheme is not considered to be known to the person skilled in the art because the above technology scheme is described in the background of the present disclosure.

SUMMARY

A main technical problem solved by the present disclosure is to provide a display panel and a manufacturing method capable of autonomic adjustment according to external environment.

The present disclosure provides a display panel, comprising:
 a substrate;
 a switch assembly disposed on the substrate; the switch assembly comprises an indium gallium zinc oxide (IGZO) layer; and
 a light-sensing assembly disposed on a side of the switch assembly.

The present disclosure provides a display panel, comprising:
 a substrate;
 a switch assembly disposed on the substrate; the switch assembly comprises an indium gallium zinc oxide (IGZO) layer; and
 a light-sensing assembly disposed on a side of the switch assembly.

Furthermore, the switch assembly further comprises an etching barrier layer. The etching barrier layer is disposed on the IGZO layer.

A light-sensing metal layer is disposed on an extended portion of the etching barrier layer and the light-sensing assembly is disposed on the light-sensing metal layer.

A transparent conducting layer is disposed on the light-sensing metal layer.

The light-sensing assembly comprises a P-type semiconductor layer, an intrinsic semiconductor layer, and an N-type semiconductor layer in order on the light-sensing metal layer.

Furthermore, the switch assembly comprises a gate electrode metal layer, a gate insulation layer, the IGZO layer, an etching barrier layer, a source electrode layer, and a drain electrode layer on the substrate in sequence. The source electrode layer and the drain electrode layer are in a same layer.

A light-sensing metal layer is disposed on an extended portion of the etching barrier layer and the light-sensing assembly is disposed on the light-sensing metal layer.

The light-sensing metal layer, the source electrode layer, and the drain electrode layer are in the same layer.

Furthermore, the switch assembly comprises a gate electrode metal layer, a gate insulation layer, the IGZO layer, an etching barrier layer, a source electrode layer, and a drain electrode layer on the substrate in sequence. The source electrode layer and the drain electrode layer are in a same layer.

Furthermore, the switch assembly further comprises an etching barrier layer. The etching barrier layer is disposed on the IGZO layer, and the light-sensing assembly is disposed on an extended portion of the etching barrier layer.

Furthermore, a light-sensing metal layer is disposed on an extended portion of the etching barrier layer and the light-sensing assembly is disposed on the light-sensing metal layer.

A transparent conducting layer is disposed on the light-sensing metal layer.

Furthermore, the light-sensing assembly comprises a P-type semiconductor layer, an intrinsic semiconductor layer, and an N-type semiconductor layer in order on the light-sensing metal layer.

Furthermore, a passivation layer covers the switch assembly and the light-sensing assembly.

Furthermore, a transparent conducting layer is disposed on the passivation layer corresponding to the switch assembly, and a transparent conducting layer is disposed on the passivation layer corresponding to the light-sensing assembly.

Furthermore, a light-sensing metal layer is disposed on an extended portion of the etching barrier layer and the light-sensing assembly is disposed on the light-sensing metal layer.

The light-sensing metal layer, the source electrode layer, and the drain electrode layer are in the same layer.

Furthermore, a passivation layer covers the switch assembly and the light-sensing assembly.

A transparent conducting layer is disposed on the passivation layer corresponding to the switch assembly, and a transparent conducting layer is disposed on the passivation layer corresponding to the light-sensing assembly.

The present disclosure provides a substrate;

a switch assembly disposed on the substrate; the switch assembly comprises an indium gallium zinc oxide (IGZO) layer, and a light-sensing assembly disposed on a side of the switch assembly.

The switch assembly comprises a gate electrode metal layer, a gate insulation layer, the IGZO layer, an etching barrier layer, a source electrode layer, and a drain electrode layer on the substrate in sequence, where the source electrode layer and the drain electrode layer are in a same layer.

The switch assembly further comprises an etching barrier layer; the etching barrier layer is disposed on the IGZO layer light-sensing assembly is disposed on an extended portion of the etching barrier layer.

A light-sensing metal layer is disposed on the extended portion of the etching barrier layer and the light-sensing assembly is disposed on the light-sensing metal layer.

A transparent conducting layer is disposed on the light-sensing metal layer.

The light-sensing assembly comprises P-type semiconductor layer, an intrinsic semiconductor layer, and N-type semiconductor layer in order on the light-sensing metal layer.

A light-sensing metal layer is disposed on an extended portion of the etching barrier layer and the light-sensing assembly is disposed on the light-sensing metal layer.

The light-sensing metal layer, the source electrode layer, and the drain electrode layer are in the same layer.

The present disclosure further comprises a manufacturing method for a display panel, where the manufacturing method, comprising:

providing a substrate;

forming a switch assembly on the substrate; the switch assembly comprises an indium gallium zinc oxide (IGZO) layer; and forming a light-sensing assembly on a side of the switch assembly.

Furthermore, the step for forming the switch assembly comprising:

providing a glass substrate as the substrate;

forming a gate electrode metal layer, a gate insulation layer, the IGZO layer, an etching barrier layer, a source electrode layer, and a drain electrode layer on the substrate in sequence to form the switch assembly; the source electrode layer and the drain electrode layer are in a same layer.

Furthermore, the step for forming the switch assembly comprising the IGZO layer on the substrate, comprising:

forming an etching barrier layer on the IGZO layer;

the step for forming a light-sensing assembly on a side of the switch assembly, comprising: forming the light-sensing assembly on an extended portion of the etching barrier layer.

Furthermore, the step for forming the light-sensing assembly on the extended portion of the etching barrier layer, comprising:

forming a light-sensing metal layer on the extended portion of the etching barrier layer;

forming the light-sensing assembly on the light-sensing metal layer; and forming a transparent conducting layer on the light-sensing assembly.

Furthermore, the step for forming the light-sensing assembly, comprising:

forming a P-type semiconductor layer on the light-sensing metal layer;

forming an intrinsic semiconductor layer on the P-type semiconductor layer; and forming an N-type semiconductor layer on the intrinsic semiconductor layer.

Furthermore, a passivation layer covers the switch assembly and the light-sensing assembly.

Furthermore, a transparent conducting layer is disposed on the passivation layer corresponding to the switch assembly, and a transparent conducting layer is disposed on the passivation layer corresponding to the light-sensing assembly.

Furthermore, a light-sensing metal layer is disposed on the extended portion of the etching barrier layer and the light-sensing assembly is disposed on the light-sensing metal layer.

The light-sensing metal layer, the source electrode layer, and the drain electrode layer are in the same layer.

The light-sensing assembly is proportionally disposed on the side of the switch assembly of the display panel in the display panel of the present disclosure, such as one-to-one or multiple-to-one. Thus, an external environment of a display area of the display panel, particularly to external light intensity, can be perceived by the light sensing assembly. Therefore, when the light intensity is strong, the display panel can automatically be adjusted to increase brightness and enhance contrast ratio, which avoids that the display image too dark to see. When the light intensity is weak, the display panel can automatically be adjusted to decrease brightness and reduce contrast ratio, which avoids that the display image too light to hurt eyes, which improves sensory experience. In addition, the switch assembly is made of IGZO, power consumption of the display screen is approximate to the power consumption of the OLED using the IGZO technology, cost is lower, thickness of the display screen is only 25% greater than thickness of the OLED, and resolution of the display screen can reach level degree as full high-definition or even ultra-definition (resolution 4 k*2 k). The IGZO is an amorphous oxide containing indium, gallium, and zinc. Carrier mobility of the amorphous oxide is 20-30 times of carrier mobility of amorphous silicon, which greatly improves charge and discharge rate of the TFT to the pixel electrode, improves response speed of the pixel, achieves faster refresh rate, and improves line scanning speed rate of the pixel because of faster response speed, further making the TFT-LCD have ultrahigh resolution. In addition, as a number of transistors reduce and light transmittance of each pixel is improved, an IGZO display apparatus has higher energy efficiency level and higher efficiency. Furthermore, the IGZO can be produced using existing amorphous silicon production line, which is only slightly changed, therefore, compared with cost of the low-temperature polycrystalline silicon, the IGZO is more competitive in cost.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated device or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly comprises one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation," "bonded." and "bonding" shall be understood in broad sense, and for example, may refer to fixed bonding or detachable bonding or integral bonding; may refer to mechanical bonding or electrical bonding; and may refer to direct bonding or indirect bonding through an intermediate medium or inner communication of two elements. For those of ordinary skill in the art, the meanings of the above terms in the present application may be understood according to concrete conditions.

The terms used herein are intended to merely describe concrete embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

Figure 1:
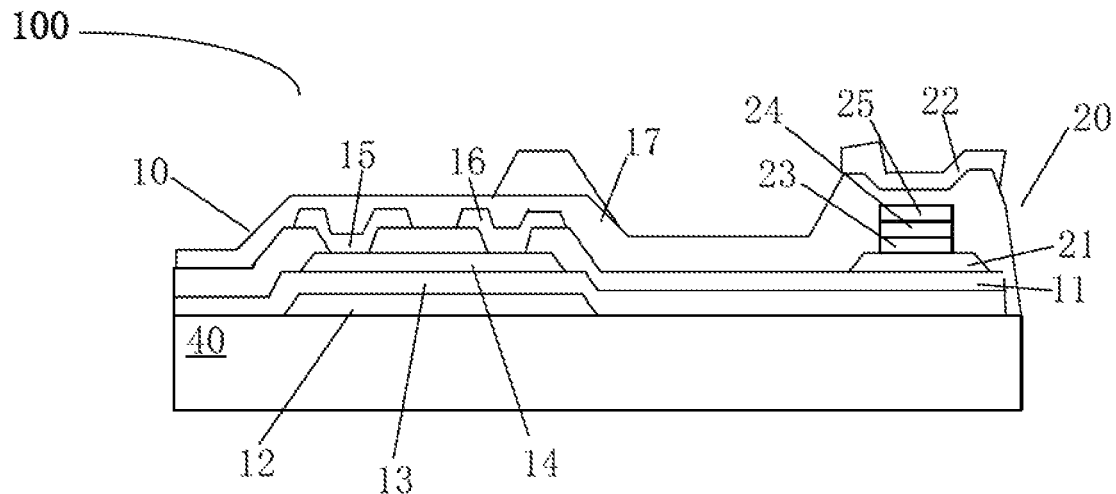
FIG. 1 is a schematic diagram of a display panel in an embodiment of the present disclosure.
Figure 2:
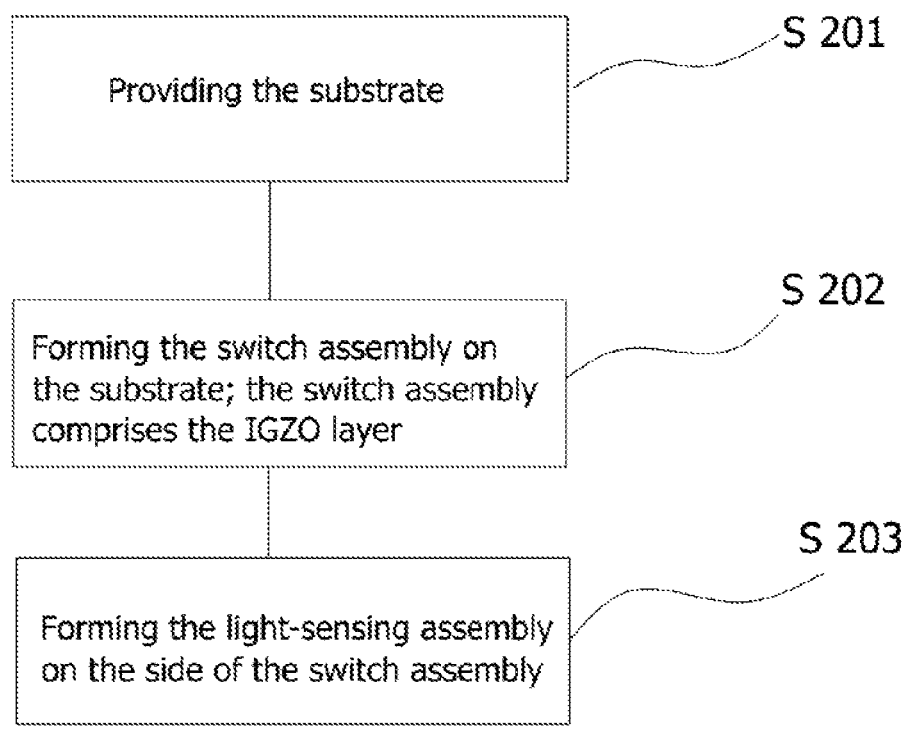
FIG. 2 is a schematic diagram of a manufacturing process of the present disclosure.

FIG. 1 is a schematic diagram of a display panel in an embodiment of the present disclosure. FIG. 2 is a schematic diagram of a manufacturing process of the display panel in an embodiment of the present disclosure. As shown in FIG. 1 and FIG. 2, the present disclosure provides the display panel, where the display panel comprises a substrate 100, a switch assembly 10 disposed on the substrate 100, and a light-sensing assembly 20 disposed on a side of the switch assembly 10. The switch assembly 10 comprises an indium gallium zinc oxide (IGZO) layer 14.

The display panel may be a liquid crystal display (LCD) or an organic light-emitting diode (OLED). When the display panel is the LCD, the display panel comprises a color resistance layer, where the color resistance layer is disposed opposite an array substrate or directly forms on the array substrate. When the display panel is a white-light OLED (using the OLED emitting white light as a pixel point light source, and colors are filtered out through red-green-blue color film). The display panel also is the OLED display panel made of a self-luminous organic material, where the OLED display panel is widely developed.

The light-sensing assembly is proportionally disposed on the side of the switch assembly of the display panel in the display panel of the present disclosure, such as one-to-one or multiple-to-one. Thus, an external environment of a display area of the display panel, particularly to external light intensity, can be perceived by the light sensing assembly. Therefore, when the light intensity is strong, the display panel can automatically be adjusted to increase brightness and enhance contrast ratio, which avoids that the display image too dark to see. When the light intensity is weak, the display panel can automatically be adjusted to decrease brightness and reduce contrast ratio, which avoids that the display image too light to hurt eyes, which improves sensory experience. In addition, the switch assembly is made of IGZO, power consumption of the display screen is approximate to the power consumption of the OLED using the IGZO technology, cost is lower, thickness of the display screen is only 25% greater than thickness of the OLED, and resolution of the display screen can reach level degree as full high-definition or even ultra-definition (resolution 4 k*2 k). The IGZO is an amorphous oxide containing indium, gallium, and zinc. Carrier mobility of the amorphous oxide is 20-30 times of carrier mobility of amorphous silicon, which greatly improves charge and discharge rate of the TFT to the pixel electrode, improves response speed of the pixel, achieves faster refresh rate, and improves line scanning speed rate of the pixel because of faster response speed, further making the TFT-LCD have ultrahigh resolution.

In addition, as a number of transistors reduce and light transmittance of each pixel is improved, an IGZO display apparatus has higher energy efficiency level and higher efficiency. Furthermore, the IGZO can be produced using existing amorphous silicon production line, which is only slightly changed, therefore, compared with cost of the low-temperature polycrystalline silicon, the IGZO is more competitive in cost.

In the embodiment, the substrate 100 comprises a glass substrate 30, where the switch assembly 10 comprises the gate electrode metal layer 12, the gate insulation layer 13, the IGZO layer 14, an etching barrier layer 11, the source electrode layer 15, and the drain electrode layer 16 on the glass substrate 30 in sequence. The source electrode layer 15 and the drain electrode layer 16 are in a same layer. In the embodiment scheme, the intrinsic semiconductor layer of the switch assembly is made of the IGZO, power consumption of the display screen is approximate to the power consumption of the OLED using the IGZO technology, cost is lower, thickness of the display screen is only 25% greater than thickness of the OLED, and resolution of the display screen can reach level degree as full high-definition or even ultra-definition (resolution 4 k*2 k).

In the embodiment, a passivation layer 17 covers the switch assembly 10 and the light-sensing assembly 20.

In the embodiment, the switch assembly 10 further comprises an etching barrier layer 11, where the etching barrier layer is disposed on the IGZO layer 14. The light-sensing assembly 20 is disposed on an extended portion of the etching barrier layer 11. In the embodiment, the etching barrier layer forms and extends along the side of the switch assembly, and the light-sensing assembly forms on the extended portion of the etching barrier layer, which saves process. The etching barrier layer uses etch-stop layer (ESL) structure having island-shape. The TFT structure of the etching barrier layer/an etching protection layer has advantages having small parasitic capacitor, which is widely used, and improves the IGZO layer.

In the embodiment, a light-sensing metal layer 21 is disposed on the extended portion of the etching barrier layer 11 and the light-sensing assembly 20 is disposed on the light-sensing metal layer 21.

A transparent conducting layer 22 is disposed on the light-sensing assembly 20. In the embodiment, the light-sensing metal layer, the source electrode layer, and the drain electrode layer are in the same layer and forms together, which saves process. The light-sensing metal layer is regarded as a bottom electrode of the light-sensing assembly, and the transparent conducting layer is regarded as a top electrode of the light-sensing metal layer. Thus, the light-sensing assembly senses light intensity of surrounding of the display area by electrical signal difference between the top and bottom electrode to provide data for automatic regulation of the display panel.

In the embodiment, the light-sensing assembly 20 comprises P-type semiconductor layer 23, an intrinsic semiconductor layer 24, and N-type semiconductor layer 25 in order on the light-sensing metal layer 21. The P-type semiconductor layer 23 is a high-concentration doped P-type intrinsic semiconductor layer (P+α-Si), the intrinsic semiconductor layer 24 is α-Si, and the N-type semiconductor layer is a high-concentration doped N-type intrinsic semiconductor layer (N+α-Si). The three semiconductor layers forms body of the light-sensing assembly to sense light intensity of surrounding of the display area according to the top and bottom electrode.

In the embodiment, transparent conducting layers (transparent conducting layer corresponding to the switch assembly 10 does not show in drawings) respectively corresponding to the switch assembly 10 and the light-sensing assembly 20 are disposed on the passivation layer 17. The two transparent conducting layers are in a same layer using a photomask process, which saves process. The transparent conducting layer forms together, which meets requirement of the switch assembly and requirement of the top electrode of the light-sensing assembly.

In the embodiment, the light-sensing metal layer 21 is disposed on the extended portion of the etching barrier layer 11 and the light-sensing assembly 20 is disposed on the light-sensing metal layer 21.

The light-sensing metal layer 21, the source electrode layer 15, and the drain electrode layer 16 are in the same layer, which uses one same photomask process.

Figure 3:
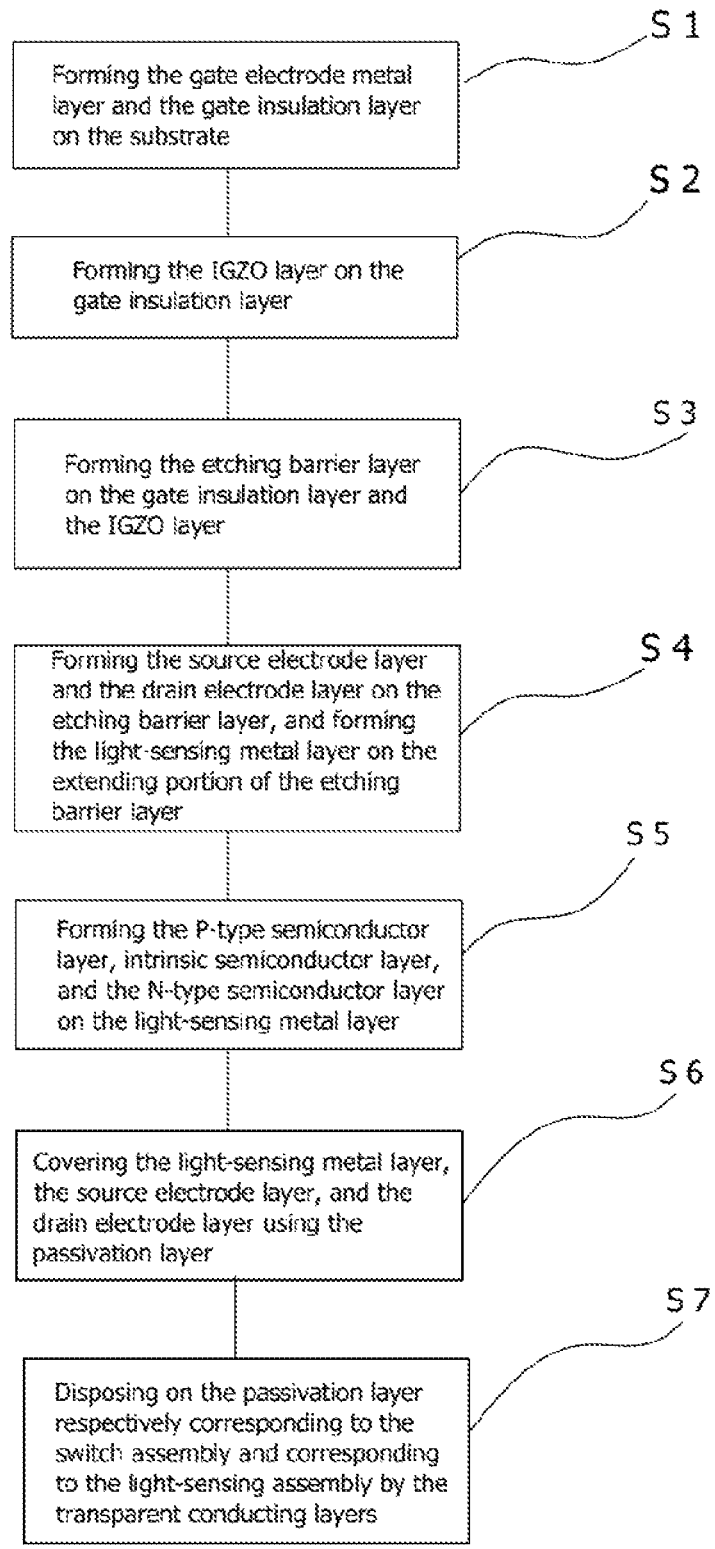
FIG. 3 is a flowchart of a manufacturing method of the display panel in an embodiment of the present disclosure.

FIG. 3 is a flowchart diagram of a manufacturing method for the display panel of the present disclosure. As shown in FIG. 3 combined with FIG. 1 and FIG. 2, the present disclosure further provides the manufacturing method for the display panel, where the manufacturing method for the display panel comprises:

S201: providing the substrate;
S202: forming the switch assembly on the substrate; the switch assembly comprises the IGZO layer; and
S203: forming the light-sensing assembly on the side of the switch assembly.

Furthermore, the step for forming the switch assembly on the substrate, comprising:

providing a glass substrate as the substrate;
forming the gate electrode metal layer, the gate insulation layer, the IGZO layer, the etching barrier layer, the source electrode layer, and the drain electrode layer on the substrate in sequence to form the switch assembly, the source electrode layer and the drain electrode layer are in the same layer.

Furthermore, the step for forming the switch assembly comprising the IGZO layer on the substrate, comprising forming the etching barrier layer on the IGZO layer;
the step for forming a light-sensing assembly on a side of the switch assembly, comprising: forming the light-sensing assembly on the extended portion of the etching barrier layer.

Furthermore, the step for forming the light-sensing assembly on the extended portion of the etching barrier layer, comprising:

forming the light-sensing metal layer on the extended portion of the etching barrier layer;
forming the light-sensing assembly on the light-sensing metal layer;
forming the transparent conducting layer on the light-sensing assembly.

Furthermore, the step for forming the light-sensing assembly, comprising:

forming a P-type semiconductor layer on the light-sensing metal layer;
forming an intrinsic semiconductor layer on the P-type semiconductor layer; and
forming an N-type semiconductor layer on the intrinsic semiconductor layer.

Furthermore, the passivation layer covers the switch assembly and the light-sensing assembly.

In this embodiment, the transparent conducting layer is disposed on the passivation layer corresponding to the switch assembly, and the transparent conducting layer is disposed on the passivation layer corresponding to the light-sensing assembly.

In this embodiment, a light-sensing metal layer is disposed on the extended portion of the etching barrier layer and the light-sensing assembly is disposed on the light-sensing metal layer. The light-sensing metal layer, the source electrode layer, and the drain electrode layer are in the same layer.

Figure 4:
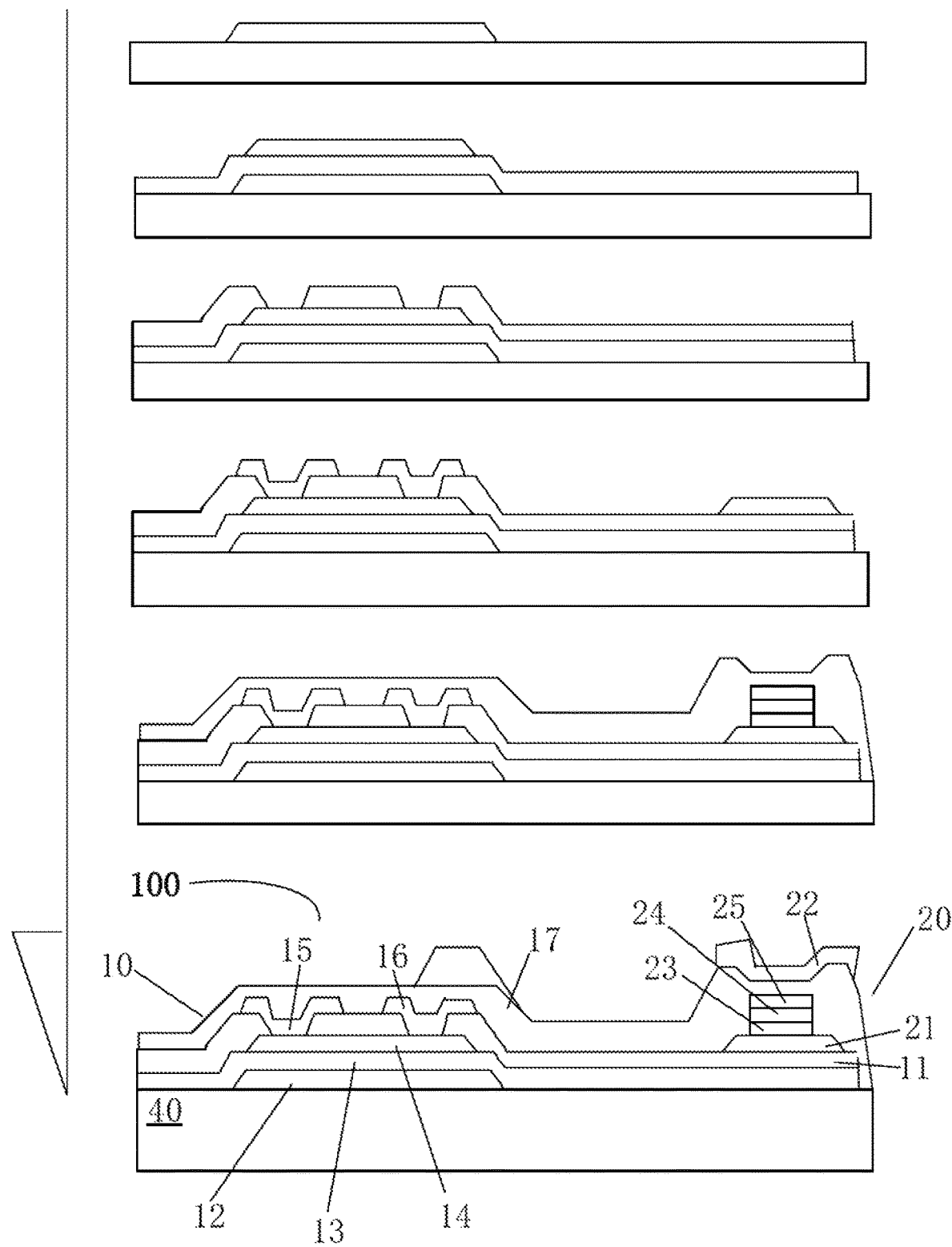
FIG. 4 is a schematic diagram of the manufacturing method of the display panel in an embodiment of the present disclosure.

FIG. 4 is a schematic diagram of the manufacturing method for the display panel of the embodiment of the present disclosure. As shown in FIG. 4, the present disclosure provides the manufacturing method for the display panel, where the manufacturing method for the display panel comprises:

S1: forming the gate electrode metal layer and the gate insulation layer on the substrate;
S2: forming the IGZO layer on the gate insulation layer;
S3: forming the etching barrier layer on the gate insulation layer and the IGZO layer;
S4: forming the source electrode layer and the drain electrode layer on the etching barrier layer, and forming the light-sensing metal layer on the extended portion of the etching barrier layer;
S5: forming the P-type semiconductor layer, intrinsic semiconductor layer, and the N-type semiconductor layer on the light-sensing metal layer;
S6: covering the light-sensing metal layer, the source electrode layer, and the drain electrode layer using the passivation layer; and
S7: disposing on the passivation layer respectively corresponding to the switch assembly and corresponding to the light-sensing assembly by the transparent conducting layers.

Figure 5:
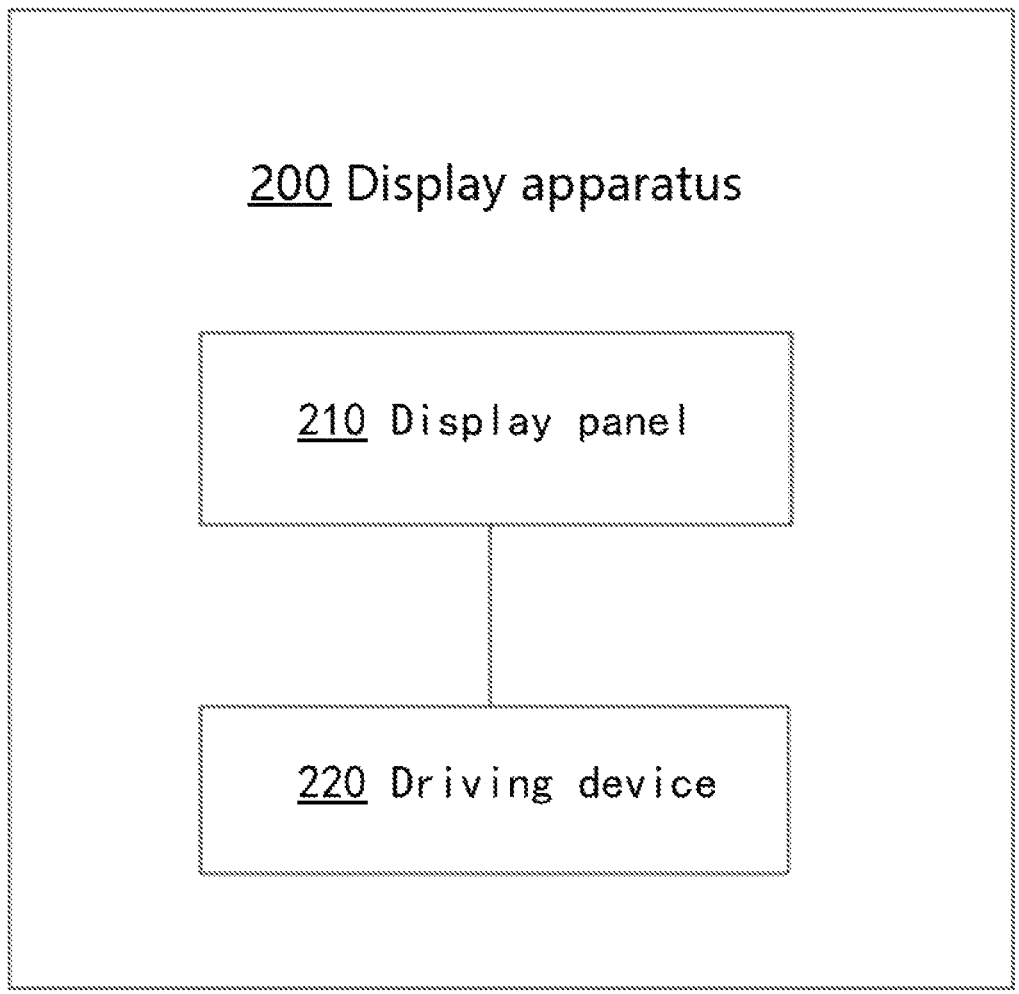
FIG. 5 is a schematic structural diagram of a display apparatus in an embodiment of the present disclosure.

FIG. 5 is a schematic diagram of the display apparatus of the embodiment of the present disclosure. As shown in FIG.

5, the present disclosure provides the display apparatus 200, where the display apparatus 200 comprises a driving device 220 and the above display panel 210.

In the embodiment, the display apparatus 200 can be twisted-nematic (TN) type, optical compensated birefringence (OCB) type, vertical-alignment (VA) type, and curved type LCD, which is not limited.

It should be understood that the display panel can be OLED, QLED, curved display panel, or other display panel.

The above description merely illustrates some exemplary embodiments of the disclosure, which however are not intended to limit the scope of the disclosure to these specific embodiments. Any equivalent structural or flow modifications or transformations made to the disclosure, or any direct or indirect applications of the disclosure on any other related fields, shall all fall in the scope of the disclosure.

What is claimed is:

1. A display panel, comprising:
a substrate;
a switch assembly disposed on the substrate; and
a light-sensing assembly disposed on a side of the switch assembly;
wherein the switch assembly comprises an indium gallium zinc oxide (IGZO) layer; wherein the switch assembly further comprises an etching barrier layer disposed on the IGZO layer, and the light-sensing assembly is disposed on an extended portion of the etching barrier layer.

2. The display panel according to claim 1, wherein
a light-sensing metal layer is disposed on an extended portion of the etching barrier layer and the light-sensing assembly is disposed on the light-sensing metal layer;
wherein a transparent conducting layer is disposed on the light-sensing metal layer assembly;
wherein the light-sensing assembly comprises a P-type semiconductor layer, an intrinsic semiconductor layer, and an N-type semiconductor layer in order on the light-sensing metal layer.

3. The display panel according to claim 1, wherein the switch assembly comprises a gate electrode metal layer, a gate insulation layer, the IGZO layer, the etching barrier layer, a source electrode layer, and a drain electrode layer on the substrate in sequence; the source electrode layer and the drain electrode layer are in a same layer;
a light-sensing metal layer is disposed on an extended portion of the etching barrier layer and the light-sensing assembly is disposed on the light-sensing metal layer;
wherein the light-sensing metal layer, the source electrode layer, and the drain electrode layer are in the same layer.

4. The display panel according to claim 1, wherein the switch assembly comprises a gate electrode metal layer, a gate insulation layer, the IGZO layer, the etching barrier layer, a source electrode layer, and a drain electrode layer on the substrate in sequence; the source electrode layer and the drain electrode layer are in a same layer.

5. The display panel according to claim 1, wherein a light-sensing metal layer is disposed on an extended portion of the etching barrier layer and the light-sensing assembly is disposed on the light-sensing metal layer;
wherein a transparent conducting layer is disposed on the light-sensing assembly.

6. The display panel according to claim 5, wherein the light-sensing assembly comprises a P-type semiconductor layer, an intrinsic semiconductor layer, and an N-type semiconductor layer in order on the light-sensing metal layer.

7. The display panel according to claim 6, wherein a passivation layer covers the switch assembly and the light-sensing assembly.

8. The display panel according to claim 7, wherein a transparent conducting layer is disposed on the passivation layer corresponding to the switch assembly, and a transparent conducting layer is disposed on the passivation layer corresponding to the light-sensing assembly.

9. The display panel according to claim 4, wherein a light-sensing metal layer is disposed on an extended portion of the etching barrier layer and the light-sensing assembly is disposed on the light-sensing metal layer;
wherein the light-sensing metal layer, the source electrode layer, and the drain electrode layer are in the same layer.

10. The display panel according to claim 2, wherein a passivation layer covers the switch assembly and the light-sensing assembly;
wherein a transparent conducting layer is disposed on the passivation layer corresponding to the switch assembly, and a transparent conducting layer is disposed on the passivation layer corresponding to the light-sensing assembly.

11. A display panel, comprising:
a substrate;
a switch assembly disposed on the substrate; and
a light-sensing assembly disposed on a side of the switch assembly;
wherein the switch assembly comprises an indium gallium zinc oxide (IGZO) layer;
wherein the switch assembly comprises a gate electrode metal layer, a gate insulation layer, the IGZO layer, an etching barrier layer, a source electrode layer, and a drain electrode layer on the substrate in sequence; the source electrode layer and the drain electrode layer are in a same layer;
wherein the switch assembly further comprises an etching barrier layer; the etching barrier layer is disposed on the IGZO layer; light-sensing assembly is disposed on an extended portion of the etching barrier layer;
wherein a light-sensing metal layer is disposed on the extended portion of the etching barrier layer and the light-sensing assembly is disposed on the light-sensing metal layer;
wherein a transparent conducting layer is disposed on the light-sensing assembly;
wherein the light-sensing assembly comprises P-type semiconductor layer, an intrinsic semiconductor layer, and N-type semiconductor layer in order on the light-sensing metal layer;
a light-sensing metal layer is disposed on an extended portion of the etching barrier layer and the light-sensing assembly is disposed on the light-sensing metal layer;
wherein the light-sensing metal layer, the source electrode layer, and the drain electrode layer are in the same layer.

* * * * *